United States Patent [19]

Kanahara et al.

[11] Patent Number: 4,811,893
[45] Date of Patent: Mar. 14, 1989

[54] METHOD FOR BONDING COPPER PLATE TO ALUMINA SUBSTRATE AND PROCESS FOR PRODUCING COPPER/ALUMINA BONDED ASSEMBLY

[75] Inventors: Naoyuki Kanahara; Masahiro Furo, both of Hachioji; Tetsuo Furihata, Kodaira, all of Japan

[73] Assignee: Dowa Mining Co., Ltd., Tokyo, Japan

[21] Appl. No.: 126,601

[22] Filed: Nov. 30, 1987

[30] Foreign Application Priority Data

Dec. 27, 1986 [JP] Japan ................. 61-316143

[51] Int. Cl.$^4$ .................. B23K 35/38; B23K 20/14
[52] U.S. Cl. ...................... 228/198; 228/238; 228/263.12; 228/263.18; 65/59.3
[58] Field of Search ............ 228/193, 198, 219, 238, 228/263.12, 263.18, 903; 65/59.1, 59.3

[56] References Cited

U.S. PATENT DOCUMENTS

| | | | |
|---|---|---|---|
| 3,531,853 | 10/1970 | Klomp | 228/193 |
| 3,994,430 | 11/1976 | Cusano et al. | |
| 4,032,058 | 6/1977 | Riseman | 228/180.2 |
| 4,050,956 | 9/1977 | de Bruin et al. | 228/193 |
| 4,129,243 | 12/1978 | Cusano et al. | |

FOREIGN PATENT DOCUMENTS

761045 11/1956 United Kingdom .

Primary Examiner—Nicholas P. Godici
Assistant Examiner—Samuel M. Heinrich
Attorney, Agent, or Firm—Herbert Goodman

[57] ABSTRACT

A novel method for directly bonding a copper plate to an alumina substrate is disclosed. Also disclosed is a process by which bonded assembles of copper plate and alumina substrate can be produced in large volumes on an industrial scale in high yield and at low cost employing a simplified sequence of steps. According to this process, a copper plate is positioned in contact with an alumina substrate in an inert atmosphere, and the combination is heated to a temperature lower than the melting point of copper (1,083° C.), preferably to a temperature lower than the eutectic point of copper-copper oxide eutectic, for example, to 1,063° C.±0.5° C., so that a compound of copper with alumina on the surface of the alumina substrate and a compound of copper with at least one glass forming material on said surface are formed without forming the liquidus eutectic of copper and copper oxide in the area of contact between the copper plate and the alumina substrate, and thereafter the combination is cooled to establish direct bond between the two members. Also disclosed herein are specific techniques that may be employed to produce bonded assemblies in large quantities by the present invention using an industrial conveyor furnace, such as those concerning the method of positioning the combination of copper plates and alumina substrates to be charged into the furnace, the temperature in the furnace and the atmosphere therein.

6 Claims, 3 Drawing Sheets

(a)

(b)

METHOD FOR BONDING COPPER PLATE TO ALUMINA SUBSTRATE AND PROCESS FOR PRODUCING COPPER/ALUMINA BONDED ASSEMBLY

TECHNICAL FIELD

The present invention relates to a method for direct bonding of a copper plate to an alumina substrate. More particularly, the present invention relates to a method for bonding a copper plate to an alumina substrate by which bonded assemblies of copper plate and alumina substrate can be produced in large quantities on a commercial scale at low cost and in high yield employing a simplified production scheme.

BACKGROUND ART

Copper plates have conventionally been bonded to an alumina substrate by two methods. In the first method, a copper paste containing a binder is coated on an alumina substrate and subsequently dried and fired so that the binder in the paste is caused to react not only with the glass forming material in the alumina substrate but also with the copper plate itself. In the second method, a reactive metal (brazing filler material) sandwiched between an alumina substrate and a copper plate is heated at a temperature higher than the melting point of the reactive metal so that the copper plate is bonded to the alumina substrate through diffusion that occurs between the substrate and the reactive metal and between the copper plate and the reactive metal.

With the recent trend for semiconductor devices to be directed toward larger power consumption, higher scales of integration and use of modules, there has been a growing need to increase their efficiency with respect to heat dissipation from the ceramic substrate, to simplify the procedures for packaging semiconductor chips and to improve the reliability of the devices. In response to this need, various methods have been proposed by which a copper circuit board can be directly bonded to an alumina substrate without using the conventional copper paste or brazing filler material.

British Patent No. 761,045 to Lodge Plugs Limited describes a method for bonding copper directly to a ceramic substrate. In this method, a copper plate that has been strongly oxidized is positioned on the alumina substrate and the combination is heated to a temperature that is higher than 1,083° C. (the melting point of copper) but which is lower than the melting point of cuprous oxide (ca. 1,200° C.). During the heat cycle, the majority of the cupric oxide present is converted to the cuprous form and the copper plate becomes molten but the cuprous oxide remains unmelted to form a layer at the interface between the alumina substrate and the copper plate.

Japanese Patent Publication No. 4154/1985 filed by General Electric Company claiming priority from U.S. Ser. Nos. 600,300 and 696,899 (inventors: D. A. Cusano et al.) describes an invention entitled "A Method for Bonding Copper Members to a Ceramic Substrate". According to this method, a copper oxide 25 layer having a thickness of 200–5,000 Å is formed on the surface of either a copper member or a ceramic substrate before the copper member is positioned on the substrate and the combination is heated in an inert atmosphere to a temperature between 1,065° C. (the eutectic temperature of the copper-copper oxide eutectic) and 1,083° C. to produce a hypoeutectic melt of copper and copper oxide at the interface between the copper plate and the substrate, and is subsequently cooled.

The two prior art methods described above differ from each other in that the combination of copper plate and alumina substrate is heated to a temperature higher than the melting point of copper (1,083° C.) in the first method whereas the combination is heated to a temperature below that point. However, they are the same in that the copper plate is directly bonded to the alumina substrate without employing an interposing material that wets both copper and alumina. In the latter method, a liquidus eutectic of copper and copper oxide is used as a bonding agent.

However, the method described in Japanese Patent Publication No. 4154/1985 has the disadvantage that the wetting effect of the liquidus eutectic formed at the interface of the bond between the copper plate and the ceramic substrate can cause displacement of the former over the latter. The present inventors confirmed by experiment that the problem of such displacement was pronounced when a small copper plate was to be bonded to the alumina substrate.

The formation of the liquidus eutectic is also disadvantageous in that it impairs the inherent flatness of the copper plate and should be avoided as much as possible if the bonded assembly of copper and alumina is to be used as a substrate for mounting electronic components because surface roughness is one of the important parameters determining device reliability.

When bonding is effected using a eutectic melt, there is a high likelihood that bulging will occur during solidification of the melt on account of oxygen. Bulging present in the bonded assembly of copper plate and alumina substrate retards heat dissipation and is detrimental to the efficiency of the subsequent assembly operations.

Therefore, although the method described in Japanese Patent Publication No. 4154/1985 is capable of providing a satisfactory assembly of a copper member directly bonded to an alumina substrate, the performance of the assembly as a board for installing electronic components and its production rate are still insufficient to meet current requirements which are becoming steadily more rigorous as a result of the recent rapid advances in semiconductor technology. Furthermore, there still remains room for improvement in terms of such aspects as high-volume production and cost reduction.

SUMMARY OF THE INVENTION

An object, therefore, of the present invention is to provide a method for directly bonding a copper plate to an alumina substrate.

Another object of the present invention is to provide a process for producing a bonded assembly of copper plate and alumina substrate which does not suffer from the aforementioned disadvantages of the prior art and yet which allows production in large quantities on a commercial scale with high yields and at low cost.

The present inventors conducted intensive studies in order to attain this object and have accomplished the present invention which is based on the following findings.

The inventors started with the idea of forming at the interface between a copper plate and an alumina substrate $CuAl_2O_4$ based compound resulting from a reaction between copper and alumina. By utilizing this reaction for the formation of the specified compound at elevated temperatures, the present inventors succeeded in bonding the copper plate directly to the alumina substrate. According to the finding of the present inventors, the surface of a 96% alumina substrate is rich in glass forming materials such as $SiO_2$, MgO and CaO and when the interface of the copper plate and the alumina substrate is heated, copper forms a certain compound with alumina by the agency of these glass formers in such a way that the copper plate is firmly bonded to the alumina substrate. This interfacial compound forming reaction starts at the point of contact between the copper plate and the alumina substrate and may be readily encouraged to proceed to cover the entire portion of the interface by properly selecting the temperature, time and atmosphere conditions employed. It is therefore clear that the bond in the assembly of copper plate and alumina substrate produced by the present invention is not the product of solidification of liquidus Cu-O eutectic (i.e., copper-copper oxide eutectic).

The present invention provides a method of bonding a copper plate to an alumina substrate which comprises heating in an inert atmosphere a combination of the copper plate and the alumina substrate in contact with each other to a temperature lower than 1,083° C., forming a compound of copper with alumina on the surface of the alumina substrate and a compound of copper with at least one glass forming material on said surface without forming a liquidus eutectic of copper and copper oxide in the area of contact between the copper plate and the alumina substrate, and cooling the assembly.

The present invention also relates to a process for producing a bonded assembly of a copper plate and an alumina substrate which comprises:

a step in which an alumina substrate having predetermined snap lines is positioned in contact with a smaller copper plate, the combination is heated in an inert atmosphere to a temperature lower than 1,083° C., a compound of copper with alumina on the surface of the alumina substrate and a compound of copper with at least one glass forming material on said surface are formed without forming a liquidus eutectic of copper and copper oxide in the area of contact between the copper plate and the alumina substrate, and the assembly is subsequently cooled;

a step of forming an electronic circuit on the copper plate in the assembly by etching; and a step of dividing the assembly into segments by cutting along the snap lines.

BRIEF DESCRIPTION OF THE DRAWINGS

FIG. 6($b$) is a cross section of the etched assembly.

DETAILED DESCRIPTION OF THE INVENTION

Figure 1:
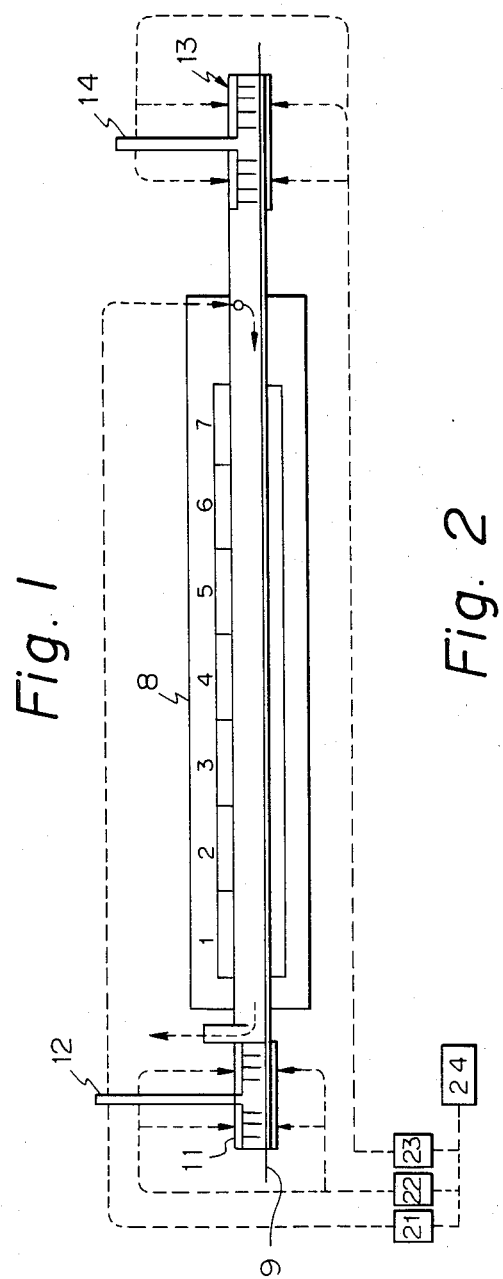
FIG. 1 is a schematic cross section of a conveyor furnace suitable for use in implementation of the present invention on an industrial scale.

The process for producing an assembly of a copper plate bonded to an alumina substrate according to the present invention is hereinafter described step by step. The copper plate to be bonded to an alumina substrate by the method of the present invention is made of pure copper and any copper plate that is commercially available as oxygen-free copper, tough pitch copper or deoxidized copper may be employed. The alumina substrate to which the copper plate is to be bonded is either a commercially available 96% alumina substrate, or a less pure (92%) or a much purer (99.6%) alumina substrate, all of which must have surface properties that are tolerable for practical applications.

The copper plate to be bonded to the alumina substrate must be smaller than the latter in size. If the size of the copper plate is equal to or greater than that of the alumina substrate, the copper plate, when it softens upon heating, droops on the edges of the alumina substrate and is curved upward to cause bulging which prevents the production of an effective bond between the copper plate and the alumina substrate.

The copper plates cut to a predetermined size must be cleaned in order to remove any foreign matter, such as the oil that has adhered to the plates during the cutting operation or the iron that has been transferred to the plates from the cutting machine. If such foreign matter remains unremoved, the interfacial reaction will occur with this undesired matter trapped between the copper plate and the alumina substrate, and the resulting assembly may have reduced adhesion between the copper plate and the alumina substrate. In addition, when a circuit pattern is formed by etching the copper plate, the soiled surface of the alumina substrate will become exposed so as to greatly reduce the commercial value of the device incorporating electronic components on the substrate. Such foreign matter can also cause defective insulation or reduced breakdown voltage.

The steps up to this stage are identical to those involved in the usual practice of cutting copper plates and in the absence of any need to oxide the copper plates the method of the present invention has the advantage of reduced cost as compared with the prior art method in which a copper plate is bonded to an alumina substrate after it has been subjected to preliminary oxidation.

Then, the so conditioned copper plate is positioned on both sides of a fired alumina substrate. In a commercial operation, in order to ensure that the combination of the copper plate and alumina substrate will have a uniform temperature distribution during subsequent thermal reaction, it is preferred to position a plurality of copper plates of the same area on both sides of the alumina substrate. From the viewpoint of heat capacity, it is also preferred that the copper plates have the same thickness. The present inventors confirmed by experiment that when a plurality of copper plates that had the same area and thickness were positioned on an alumina substrate with their center lines being in alignment with that of the substrate, satisfactory bonded assemblies of copper plate and alumina substrate were successfully fabricated with a yield of 90% or higher.

The combination of copper plates and the alumina substrate on which they are positioned is heated to a temperature lower than 1,083° C. (the melting point of copper), preferably to a temperature lower than the eutectic point of copper-copper oxide eutectic, say 1,063°±0.5° C., and held at that temperature for a period ranging from several seconds to several minutes depending upon the size of the alumina substrate. From the viewpoint of process control, the rate of temperature elevation is preferably slow, but on the other hand, a higher rate of temperature elevation is preferred in order to achieve a high production rate and satisfactory assemblies can be produced by heating the combination of copper plates and the alumina substrate at a rate of 200°-500° C./min. The combination of copper plates and the alumina substrate on which they are positioned is fed at room temperature into a nitrogen atmosphere in which it is heated to effect bonding between the copper plates and the alumina substrate. The resulting bonded assembly is recovered from the nitrogen atmosphere at room temperature. Commercially available pure nitrogen gas may be used as the heating atmosphere and there is no particular need to control the oxygen level of this nitrogen gas by any particular method such as mixing it with oxygen since it is already adjusted to an oxygen level of 20 ppm and below. The present inventors confirmed by experiment that satisfactory assemblies could be obtained by using a heating atmosphere having an oxygen level of 0.5-2 ppm. If an oxygen-rich atmosphere is employed, a film of cupric or cuprous oxide forms on the surface of the copper plates in the assemblies during subsequent cooling and it is well known that this copper oxide film impairs solderability or platability.

According to the present invention, copper plates are bonded to an alumina substrate through the reaction for the formation of a compound of Cu and $Al_2O_3$ at elevated temperatures. When the fractured surface of an assembly that was created by peeling the copper plate from the alumina substrate was examined with a scanning electron micrograph (SEM), it was found that the bonding between copper and alumina had started from a point of contact between the copper plate and the alumina substrate and that a compound of copper with a glass former in the alumina substrate formed at the interface between the copper plate and the substrate. Analysis by X-ray diffraction showed that a $CuAl_2O_4$ spinel compound and $Al_7Cu_3Mg_6$ had also formed in the fractured surface of the assembly. However, nothing was found to have resulted from the solidification of a copper-copper oxide eutectic melt.

A conveyor furnace that can be used in implementing the method of the present invention on an industrial scale is shown schematically in FIG. 1. Using this conveyor furnace, copper plates can be effectively bonded to an alumina substrate in a nitrogen atmosphere with an oxygen concentration of 20 ppm and below by employing a constant rate of temperature elevation, reaction temperature and cooling speed. Since it is not necessary to control the atmosphere in the furnace by any special means, assemblies of copper plates and an alumina substrate can be produced at low cost in large quantities on an industrial scale.

Stated more specifically, the operation in the conveyor furnace shown in FIG. 1 will proceed as follows. First, the alumina substrate carrying a copper plate on both sides is placed on a belt 9 in the furnace, with spacers being put on the belt to avoid direct contact between the belt and the copper plate under the substrate. The spacers may be rectangular rods or pins but they should be made of materials that will not react with copper such as to adversely affect the atmosphere in the furnace.

The external atmosphere is isolated from the interior of the furnace by means of an entrance curtain 11 that is made of nitrogen gas. The nitrogen gas introduced to form the curtain 11 is discharged through an exhaust port 12. The discharge of nitrogen gas is spontaneous since the pressure at which it is supplied is higher than one atmosphere.

The alumina substrate carrying copper plates to be bonded thereto is fed into a first heating zone 1 in the furnace 8 and passes through subsequent heating zones 2-7 in the numbered order. The temperature in each heating zone is precisely controlled by means of a thermocouple specifically provided in each zone.

Figure 2:
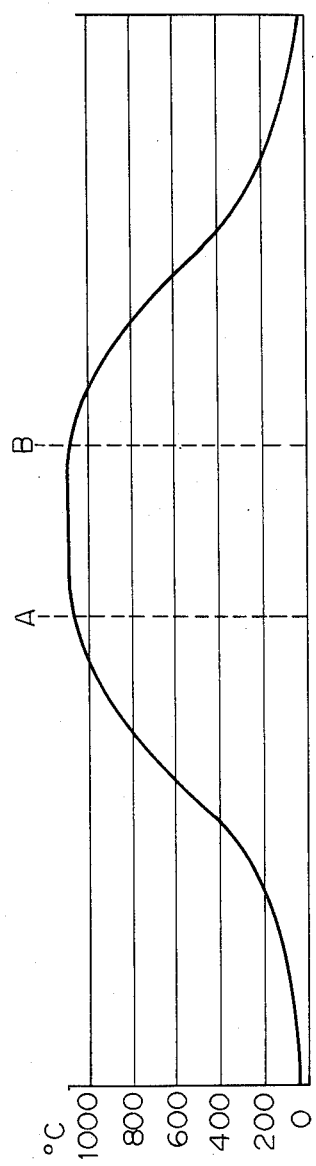
FIG. 2 is a temperature profile showing the temperature distribution in the conveyor furnace shown in FIG. 1.

The substrate passing through the sequence of heating zones will reach the reaction temperature range (A-B) of the profile shown in FIG. 2 which corresponds to the temperature distribution in the furnace, and in this temperature range a compound of copper with alumina and a compound of copper with at least one glass former in the substrate will form at the interface between the copper plates and the alumina substrate so as effect bonding between the two members. The length of the reaction temperature range (A-B), or the reaction time, can be properly set by controlling the speed at which the belt 9 runs in the conveyor furnace. The reaction temperature is set at a value lower than the melting point of copper (1,083° C.) and, in a commercial operation, the reaction is carried out at 1,063°±0.5° C. for 8-10 minutes. The substrate that has undergone the intended reaction and to which the copper plates have been bonded is then fed into a cooling zone but actual cooling starts when the assembly comes close to the end of heating zone 7 so that cracking will not be caused by rapid cooling on account of thermal expansion mismatch between the copper plates and the alumina substrate.

After passing through heating zone 7, the assembly advances into an exit curtain 13, where it is further cooled down to close to room temperature before it is recovered at the exit. The nitrogen gas of which the exit curtain is made is supplied independently of the furnace and discharged through an exhaust port 14. Although not shown, a water cooling device is provided at the exit curtain.

As described above, the entrance curtain, the furnace and the exit curtain are independently supplied with nitrogen gas and this is in order to eliminate any variation that may be caused in the temperature within the furnace by the gas stream. The absence of such temperature variation is essential if large quantities of satisfactory assemblies are to be produced in high yield. However, it should be noted that there is no need to provide a separate nitrogen source for each of the entrance curtain, the furnace and the exit and, as depicted in FIG. 1, nitrogen gas from the same source of supply (e.g. $N_2$ gas evaporated from a liquid nitrogen tank) may be permitted to flow into the respective areas with its volume adjusted by flow meters 21, 22 and 23. It is also unnecessary to mix the supplied nitrogen gas with oxygen.

The following example is provided for the purpose of further illustrating the present invention but is in no way to be taken as limiting.

EXAMPLE

Figure 3:
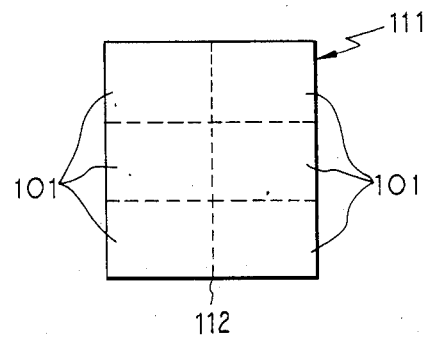
FIGS. 3-5 illustrate the production of bonded assembly of copper plates and an alumina substrate using the conveyor furnace shown in FIG. 1, FIG. 3 being a plan view of the alumina substrate, FIG. 4 being a cross section of a combination of copper plates and alumina substrate to be placed on a belt in the furnace shown in FIG. 1, and FIG. 5 being a plan view of a plurality of the combinations on the belt.

FIG. 3 shows the 96% alumina substrate used in this example. The substrate indicated by 111 was fired in a size of 70×78×0.635 mm and provided with snap lines 112 so that it could be later cut with a laser beam into six segments 101 each measuring 35×26 mm.

A deoxidized copper sheet stock 0.3 mm thick was cut into 68×76 mm plates by shearing, which were immersed in acetone of a commercial grade and cleaned by ultrasonic wave application.

Figure 4:
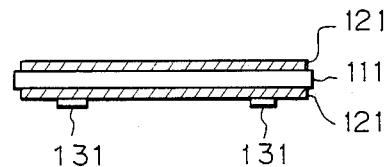
Figure 5:
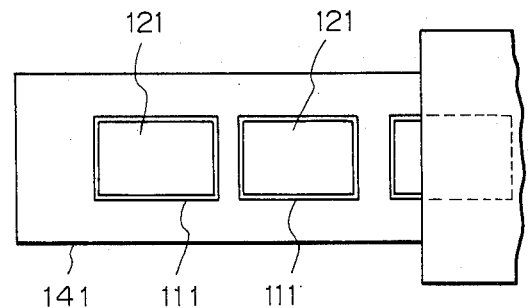

Copper plates 121 were positioned on the alumina substrate 111 as shown in FIG. 4 (cross section) and FIG. 5 (plan view) and the individual combinations were charged into a conveyor furnace (see FIG. 1) with SiC spacers 131 being placed on the belt 141 to keep each of the combinations separate from the surface of the belt.

The temperature in the furnace was so controlled that it would provide a reaction product forming range of 1,063°±0.5° C. The belt was permitted to run at such a speed that the reaction time would be 10 minutes. The combinations of copper plates and alumina substrate were successively fed into the furnace at intervals of 10 mm as shown in FIG. 5 (plan view).

Inexpensive liquid nitrogen was used as a nitrogen source for each of the entrance curtain, the interior of the furnace and the exit curtain. The liquid nitrogen was gasified with an evaporator and the resulting nitrogen gas was supplied into the three sections at controlled flow rates, so that the oxygen concentration in the atmosphere in the furnace would be held at 2 ppm.

Bonded assemblies were recovered from the exit of the furnace in high yield and 98 out of 100 assemblies produced complete bonding between copper plates and the alumina substrate. Since the temperature of the outer surface of the copper plate in each of the recovered assemblies exceeded the point of secondary recrystallization, it was uneven on the grain boundaries but none of the bonded copper plates showed any excessive waviness or warpage.

Figure 6:
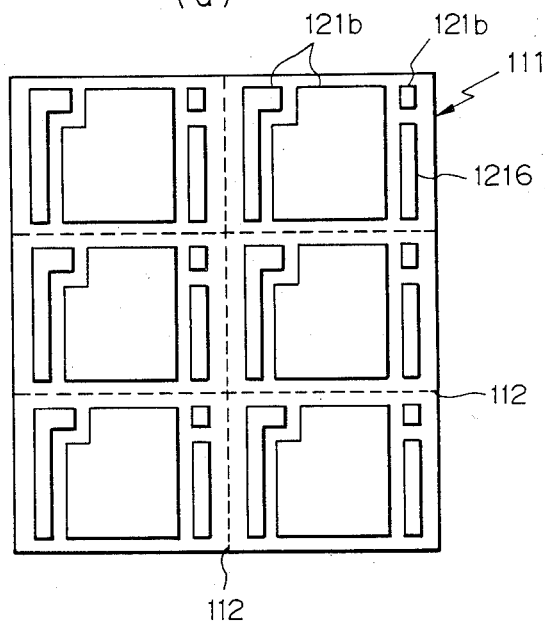
FIG. 6($a$) is a plan view of the assembly of copper plates and alumina substrate that has been provided with a circuit pattern by etching after its production in the conveyor furnace.
Figure 6:
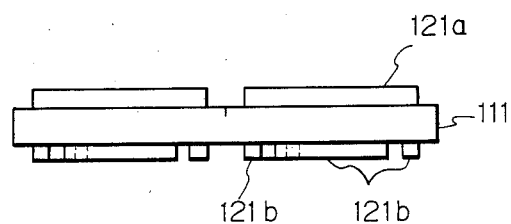

Each of the bonded assemblies was subjected to photoetching to form a circuit pattern as shown in FIG. 6(a) (plan view) and FIG. 6(b) (cross section), with copper left intact in areas 121a and 121b and copper in the other areas being etched away. The compounds formed by reaction of Cu with $Al_2O_3$ and with a glass former remained in the bonded areas from which copper had been removed but since these compounds were in the form of an oxide, there was no electrical conduction between adjacent Cu elevations or lands in the pattern.

In accordance with the present invention, highly precise pattern alignment can be achieved by using the outer dimensions of the alumina substrate as a reference and the present inventors confirmed in commercial operations that circuit patterns could be formed to the accuracy of ±150 μm and higher. Such a high precision in pattern alignment can be attained because copper plates smaller in size than the alumina substrate are positioned on the latter in such a way that a certain distance from the edges of the substrate is kept around the circumference of each copper plate. By employing this method, six assemblies of copper-alumina bond can be produced in a single step of bonding and this contributes to the high productivity of the process of the present invention.

The samples of assembly prepared in this example were subjected to a heat cycle test, one cycle consisting of holding at −50° C. for 30 minutes, then at room temperature for 10 minutes, and finally at 150° C. for 30 minutes. The samples were found to be capable of withstanding 50 of such heat cycles.

As described on the foregoing pages, the method of the present invention for directly bonding a copper plate to an alumina substrate does not involve the formation of a liquidus Cu-O eutectic at the interface of bond between the copper plate and the substrate, either through the formation of a thin layer of copper oxide on the surface of the copper plate to be bonded to the substrate, or through the supply of an adequate amount of oxygen from the copper plate during heating. Therefore, the method of the present invention is free from any of the problems associated with the presence of the liquidus Cu-O eutectic. In addition, the method does not require any special provision for conditioning the heating atmosphere, such as controlling its oxygen level in order to form the liquidus Cu-O eutectic, and this simplifies the process of fabricating bonded assemblies of copper plates and alumina substrates and enables their production in large quantities and at low cost. The assemblies have the advantage that they perform successfully in a heat cycle test conducted under severe conditions.

What is claimed is:

1. A method of bonding a copper plate to an alumina substrate which comprises heating in an inert atmosphere having an oxygen level not higher than 20 ppm a combination of the copper plate and the alumina substrate in contact with each other to a temperature lower than 1,083° C., forming a compound of copper with alumina on the surface of the alumina substrate and a compound of copper with at least one glass forming material on said surface without forming a liquidus eutectic of copper and copper oxide in the area of contact between the copper plate and the alumina substrate, and cooling the assembly.

2. A method according to claim 1 wherein the combination of a copper plate and an alumina substrate is heated to a temperature lower than the eutectic point of copper and copper oxide eutectic.

3. A process for producing a bonded assembly of a copper plate and an alumina substrate which comprises:
   a step in which an alumina substrate having predetermined snap lines is positioned in contact with a smaller copper plate, the combination is heated in an inert atmosphere having an oxygen level not higher than 20 ppm to a temperature lower than 1,083° C., a compound of copper with alumina on the surface of the alumina substrate and a compound of copper with at least one glass forming material on said surface are formed without forming a liquidus eutectic of copper and copper oxide in the area of contact between the copper plate and the alumina substrate, and the assembly is subsequently cooled;
   a step of forming an electronic circuit on the copper plate in the assembly by etching; and
   a step of dividing the assembly into segments by cutting along the snap lines.

4. A process according to claim 3 wherein the copper plate is positioned on both sides of the alumina substrate.

5. A process according to claim 4 wherein the combination of a copper plate and an alumina substrate is heated to a temperature lower than the eutectic point of copper and copper oxide eutectic.

6. A process according to claim 3 wherein the combination of a copper plate and an alumina substrate is heated to a temperature lower than the eutectic point of copper and copper oxide eutectic.

* * * * *